United States Patent [19]
Tang

[11] Patent Number: 5,626,278
[45] Date of Patent: May 6, 1997

[54] SOLDER DELIVERY AND ARRAY APPARATUS

[76] Inventor: Ching C. Tang, 2066 Verbena Ct., Fremont, Calif. 94539

[21] Appl. No.: 562,542

[22] Filed: Nov. 20, 1995

Related U.S. Application Data

[63] Continuation of Ser. No. 228,275, Apr. 15, 1994, abandoned.
[51] Int. Cl.⁶ .................................................. B23K 35/14
[52] U.S. Cl. .................. 228/56.3; 228/255; 228/246; 29/843; 439/83
[58] Field of Search ................................ 228/56.3, 255, 228/245, 246, 253, 41, 136, 179.1; 29/843; 439/83

[56] References Cited

U.S. PATENT DOCUMENTS

| | | | |
|---|---|---|---|
| 3,155,767 | 11/1964 | Schellack | 439/83 X |
| 3,528,173 | 9/1970 | Gall | 439/83 X |
| 4,303,291 | 12/1981 | Dines | 439/83 X |
| 4,484,704 | 11/1984 | Grassauer et al. | 228/56.3 X |
| 4,705,205 | 11/1987 | Allen et al. | 228/56.3 X |
| 4,712,721 | 12/1987 | Noel et al. | 228/56.3 |
| 4,842,184 | 6/1989 | Miller | 228/255 X |
| 5,175,409 | 12/1992 | Kent | 439/83 X |
| 5,184,767 | 2/1993 | Estes | 228/56.3 |
| 5,373,984 | 12/1994 | Wentworth | 228/56.3 X |
| 5,447,264 | 9/1995 | Koopman et al. | 228/56.3 |

*Primary Examiner*—J. Elpel

[57] ABSTRACT

A solder delivery and array device for soldering electronic components and/or IC chips to printed circuit boards (PCB) or substrates comprises solder performs with predetermined weight, size, shape, and a flexible retaining means with spaced openings according to the layout of pins or leads of the components and/or IC chips. The solder performs are positioned and fixed in the openings through mechanical locking. The devices are located between components and PCB or substrate during the soldering processing. By using these devices, through hole type components and surface mount type parts can be attached onto the PCB through heat reflow soldering at same time without the wave soldering process, and overheating can be avoided during the soldering process especially for the pin grid array component. Another bonus for the application of the device is shorting the required lead time for research and development in new electronic products.

17 Claims, 16 Drawing Sheets

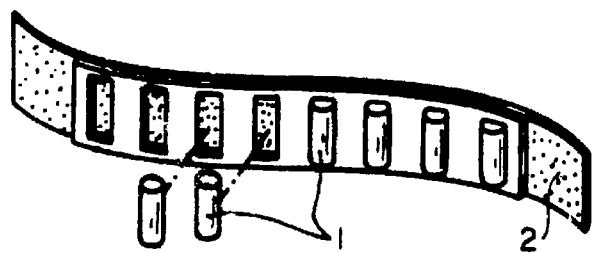
FIG. 1 "PRIOR ART"
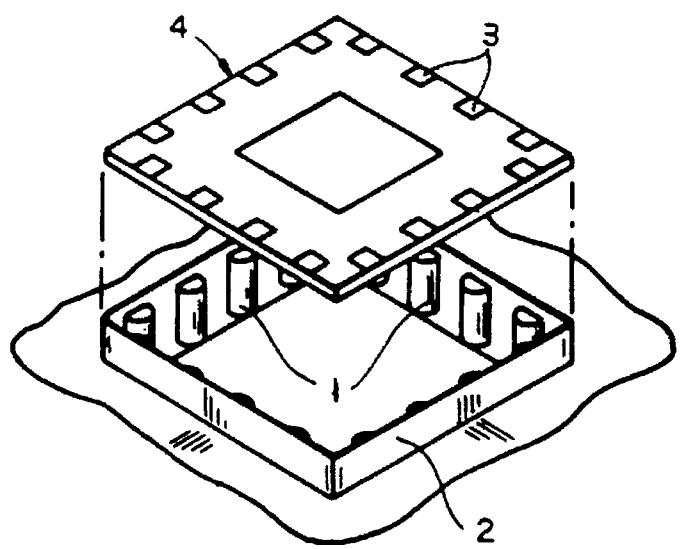
FIG. 2 "PRIOR ART"
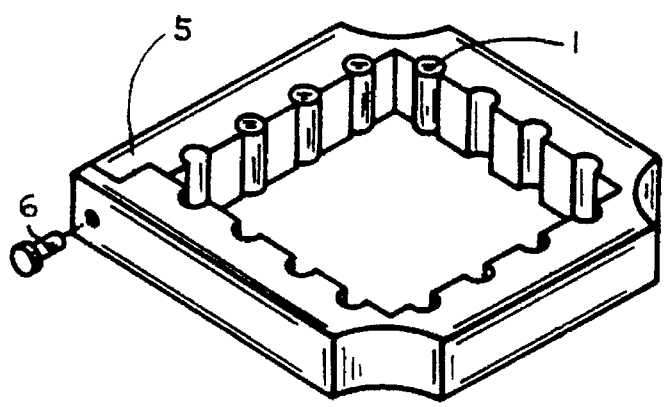
FIG. 3 "PRIOR ART"

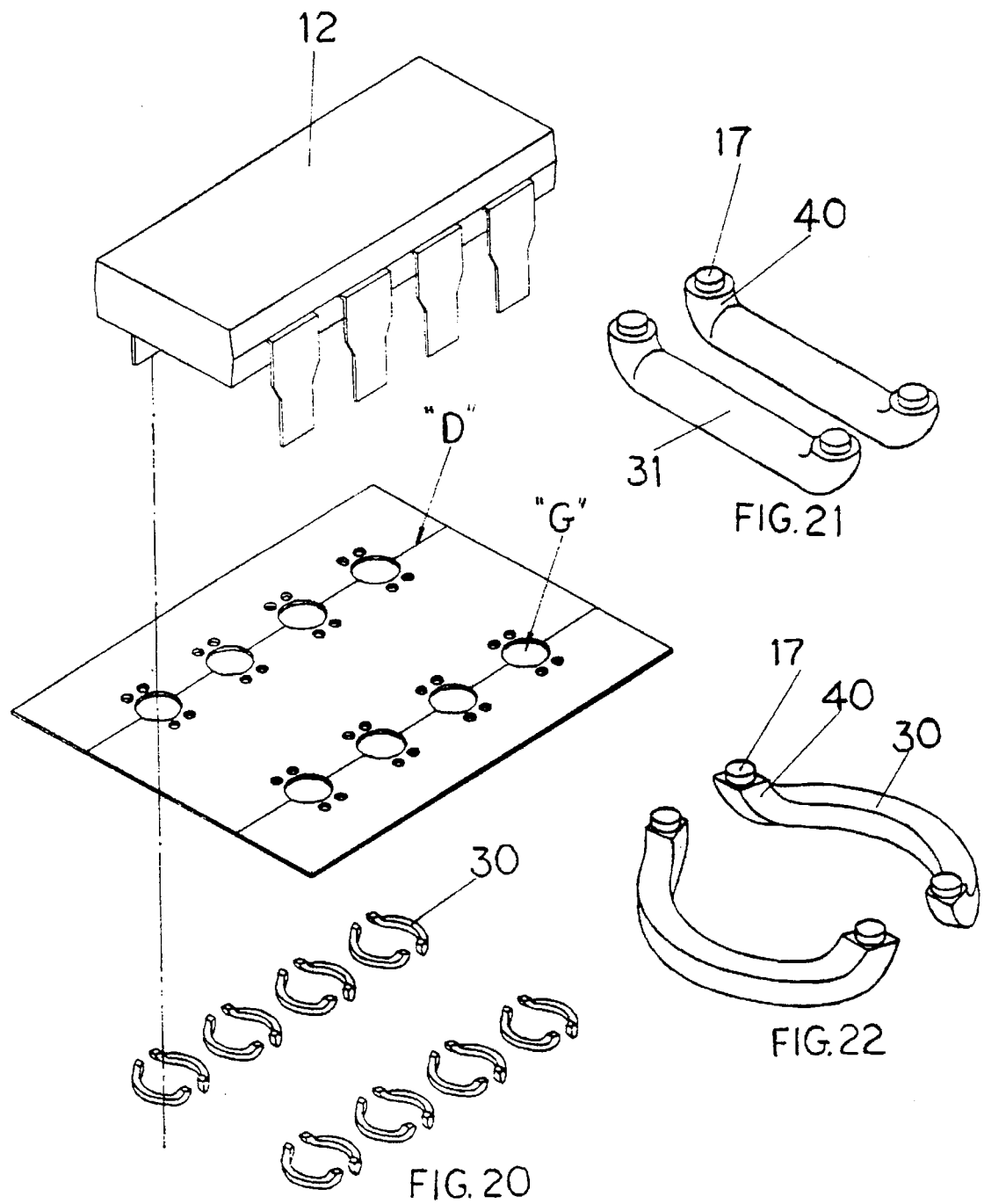

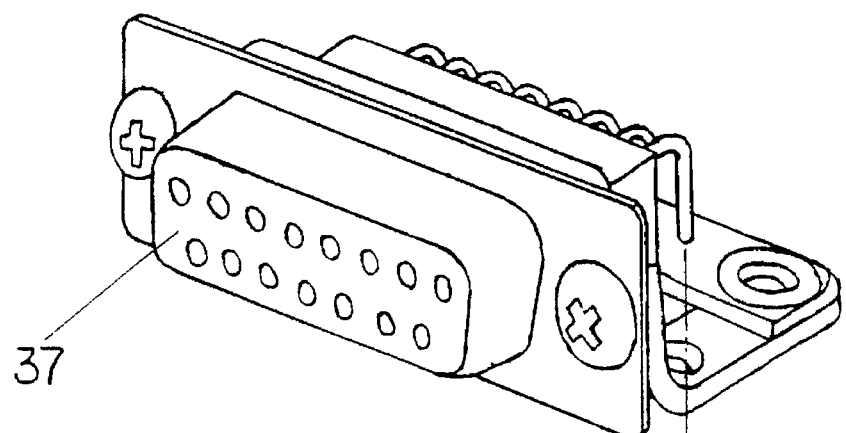
FIG.26(a)
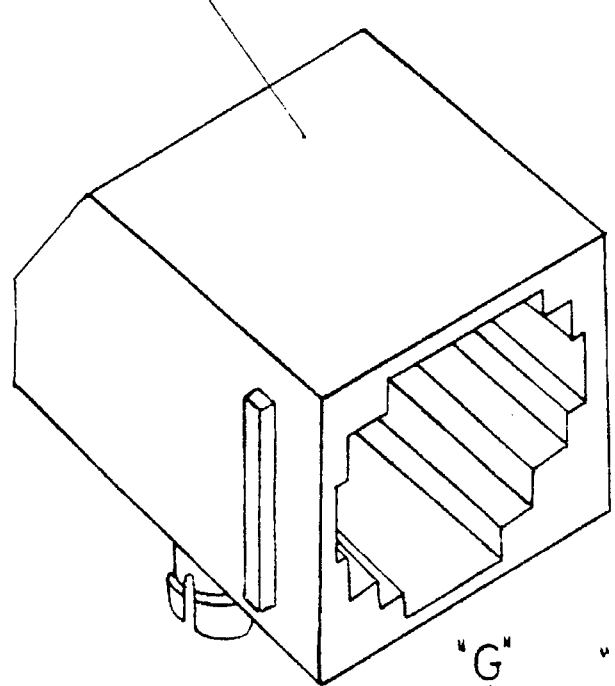
FIG. 26(b)
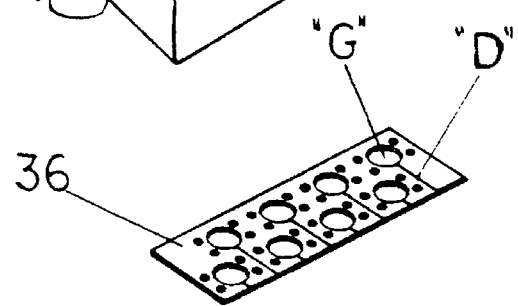

SOLDER DELIVERY AND ARRAY APPARATUS

This is a continuation in part (FWC) of application Ser. No. 08/228,275, filed Apr. 15, 1994, now abandoned.

FIELD OF INVENTION

The present invention relates to the design and fabrication of a solder delivery and array device to assemble electronic components, especially for through hole, surface mount type packages, and/or IC chips on a Printed Circuit Board (PCB) or substrate.

DESCRIPTION OF PRIOR ART

In the current commercial electronic assembly process, the formation of connections between component and substrate is done mostly by heat-fellow or wave soldering. Recently, it is the practice in many assembly processes to do heat reflow first for surface mount type parts, then wave soldering for through hole type parts. During the process of through hole part connection, the conveyor width and solder pot temperature of typical equipment needs be adjusted to fit each printed circuit board physical dimension. In the mean time, the flux unit and preheating system has to be tuned to the proper condition to get high yields of solder interconnects. Even though the temperature is strictly controlled and a lot of flux is carefully applied, some quality problems may still occur, such as open joints due to insufficient solder, a bridged joint because of too much solder, a height profile change by the buoyant force due to melting solder, and/or some components on the board being overheated due to their different thermal mass. Since the flux is applied on all bottom surface of the board, a lot of detergent will be used up to do the cleaning process and may bring up the sensitive issue of pollution of the environment. As to the interconnection process for surface mount type components, not only is another heating process such as heating reflow is required, but another process of screen printing is added in order to put solder paste on the desired location of the printing circuit board or substrate. Although this approach eliminates some defects described as above in the assembly process of though hole type parts, heating reflow equipment, solder paste printing machine and special screen tooling for each individual P.C. Board are needed in this operation.

Another issue is the life time for solder paste exposed to the air and its storage method. All these will result in higher assembly costs. One more concern is the surface mount parts not being locked along the lateral direction on the P.C. Board as through hole type parts. Therefore, the surface mount part can shift off its original position by shipping operation or by conveyer belt jerking during heating process.

U.S. Pat. No. 4,712,721 disclosed two systems to deliver the solder preforms by means of an elongated tape or a template carrier, in which these preforms are arranged to access the contact portion of the components or circuit substrate (as can be seen in FIG. 1 to FIG. 3). In FIG. 1, the preformed solder post 1 is inlaid or glued on a heat-resisting flexible positioning means 2. FIG. 2 illustrates the solder post delivery system of FIG. 1 having a chip carrier package 4 positioned with respect thereto such that the connection pads 3 on the edges of the package are in alignment with the solder posts. FIG. 3 illustrates another embodiment of these systems comprising of a rectangular frame 5 being a means of positioning solder posts 1, and discontinuous at a corner upon removal of the pin 6. In practice, these concepts are difficult to allow the solder to incorporate with the pins of the through hole type components to form the interconnection joints. With respect to the surface mount type device assembly, an extra fixture is required to align the solder post in a ribbon of KAPTON tape (KAPTON is a trademark of the EI Dupont du Nemour & Company) to a geometric configuration of the pin layout of each electronic device, and in the mean time hold these devices so they do not move during subsequent operation or heat application.

The first object of this invention is to provide a solder delivery and array device for exactly and conveniently positioning solder preforms with predetermined quantity of solder and flux. This will provide a method to form the connection between the leads or pins of electronic components, connectors, IC chips and the corresponding contacts of printed circuit board, or substrate reliably. The words "solder preform" in this invention means "preformed solder with flux".

The second object of this invention is to provide a solder delivery and array device for exactly controlling the deposition and cleaning of flux at smaller respective locations than done by well-known wave soldering processes, therefore the problem of environment pollution can be reduced.

The third object of this invention is to provide a solder delivery and array device which can use one unique piece of equipment for both through hole type packages and surface mount type packages, to do a single reflow operation in the same period in order to attach both kinds of electronic components to a printed circuit board. Therefore, the equipment for wave soldering/solder paste printing and considerable work hours can be saved. The fourth object of this invention is to provide a solder delivery and array device for attaching Pin Grid Array Components to the Printed Circuit Board without overheating by using a heat reflow process, instead of the conventional wave soldering operation.

SUMMARY

The present invention provides a solder delivery and array device for soldering through hole type electronic components (including connectors and pin grid array device) to printed circuit boards by using reflow process, comprising of:

The retaining means to position solder preforms with predetermined weight, sizes and shapes, made of heat-resistant and flexible material sheet, having a plurality of spaced openings which are, according to the layout of the pins or leads of said components, for housing and/or fixing solder preforms, and having slots for the retaining means to be stripped off after heat reflow, being a complete piece or integrated by mechanical locks applied through collars (called lugs hereafter) of said solder preforms;

solder preformed rings with flux inside or outside at the surface, predetermined weight, sizes and shapes according to the size and shape of the pins or leads of said components, being a complete piece or integrated by said retaining means;

said solder preformed rings are positioned into or at said openings and held there through mechanical locks.

The solder delivery and array device is located between the electronic components and the PCB or substrate during the assembly process.

Said solder preform with flux inside or outside at the surface can also be formed as a hollow shell opened at top and bottom for housing the pins or leads of said component, and has more than one radial arm with lugs which are inserted into the holes of said retaining means, and enlarged at the end by die press, or by laser heating, or by material deposition (plating or sputtering) to be formed as a mechanical lock for fixing the integrated retaining means.

The solder preform with flux inside or outside at the surface can also be formed as two, or more than two, arched pieces with lugs which are inserted into the holes of said retaining means, and enlarged at the end (as mentioned above) to be formed as a mechanical lock for fixing the integrated retaining means. Said solder preform with flux inside or outside at the surface can be formed as two, or more than two bars, with lugs which are inserted into the holes of said retaining means, and enlarged at the end (as mentioned above) to be formed as a mechanical lock for fixing the integrated retaining means.

Said solder preform with flux inside or outside at the surface can also be formed as a ring with an opening, having lugs which are inserted into the holes of said retaining means, and then enlarged at the ends (as mentioned above) to form mechanical locks for fixing the integrated retaining means.

The present invention also provides a solder delivery and array device for soldering surface mount type electronic parts and/or IC chips onto printed circuit boards or substrates, comprising of:

- a retaining means for positioning solder preforms with lugs and with predetermined weight, sizes and shapes, made of heat-resistant and flexible material sheet, having a plurality of spaced openings which are, according to the layout of the leads of said components and/or IC chips for accommodating and fixing solder preforms, and having slots for the retaining means to be stripped off after heat reflow, being a complete piece or integrated by mechanical locking through the lugs of solder preforms;
- solder preformed block with flux inside or outside at the surface, and with predetermined weight, sizes and shapes, according to the size and shape of the leads of said components and/or IC chips, being a complete piece or integrated by said retaining means.

Said solder preformed blocks with lugs are positioned into or at said openings and held there by mechanical locking.

The solder delivery and array device is located between electronic components, IC chips and a PCB, or substrate during the assembly process.

The solder preform with flux inside or outside at the surface can also be formed as a zig-zag shaped block with lugs which are inserted into the holes of said retaining means, and then enlarged at the end by die press, or by laser heating, or by material deposition (plating or sputtering) to be formed as a mechanical lock for fixing the integrated retaining means.

The solder preform with flux inside or outside at the surface can also be formed as a bar with lugs which are inserted into the holes of said retaining means, and enlarged at the end (as mentioned above) to be formed as a mechanic lock for fixing the integrated retaining means.

One of the important effects of the present invention is to provide the solder delivery and array device which is used to assemble through hole and surface mount electronic components (FIG. 4) onto printed circuit board at same period by using heat fellow process.

BRIEF DESCRIPTION OF THE DRAWINGS

FIG. 1, FIG. 2 and FIG. 3 show the structural schematic diagrams of prior art "solder delivery system" of U.S. Pat. No. 4,712,721, numerals:

| 1 | preformed solder post |
| 2 | positioning means |
| 3 | connection pad |
| 4 | chip carrier package |
| 5 | rectangular frame |
| 6 | pin |

Figure 4:
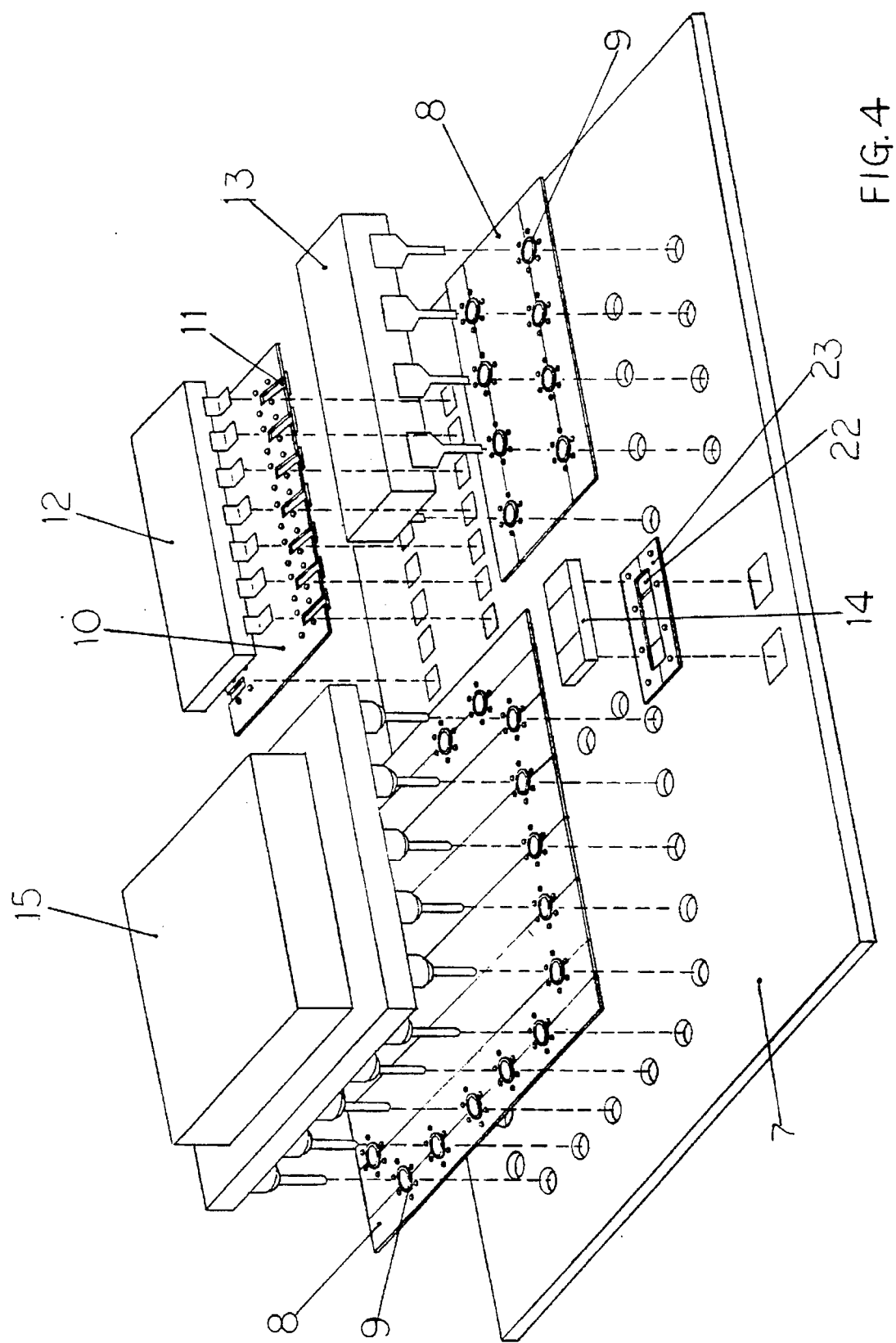

FIG. 4 is an exploded isometric view of an electronic assembly, including both through hole type/surface mount type electronic components and Printed Circuit Board (PCB), using the solder delivery and array device of the present invention located between the components and a PCB, numerals:

| 7 | PCB |
| 8 | solder delivery and array device for the through hole type component number 15, 13 |
| 9 | preformed solder ring |
| 10 | solder delivery and array device for the surface mounting type component number 12 |
| 11 | preformed solder block |
| 12 | surface mount type component |
| 13 | through hole type component |
| 14 | another type of surface mount component |
| 15 | another type of through hole component |
| 22 | preformed solder block for component number 14 |
| 23 | solder delivery and array device for the component number 14 |

Figure 5:
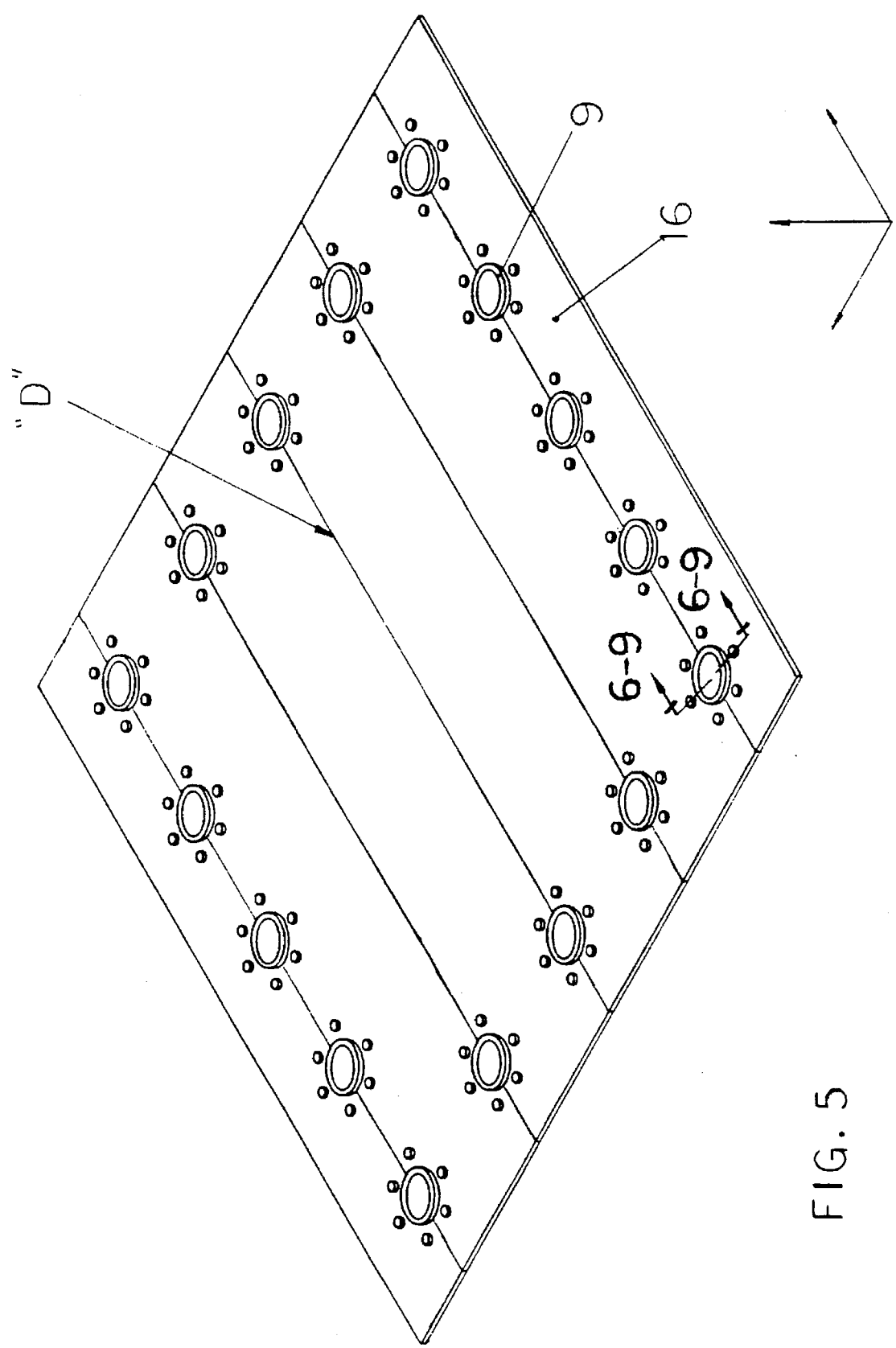
Figure 6:
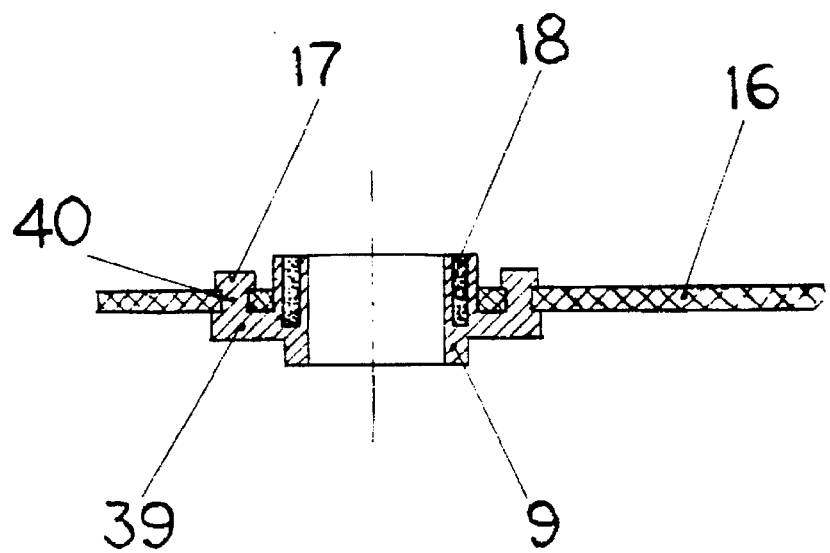
Figure 7:
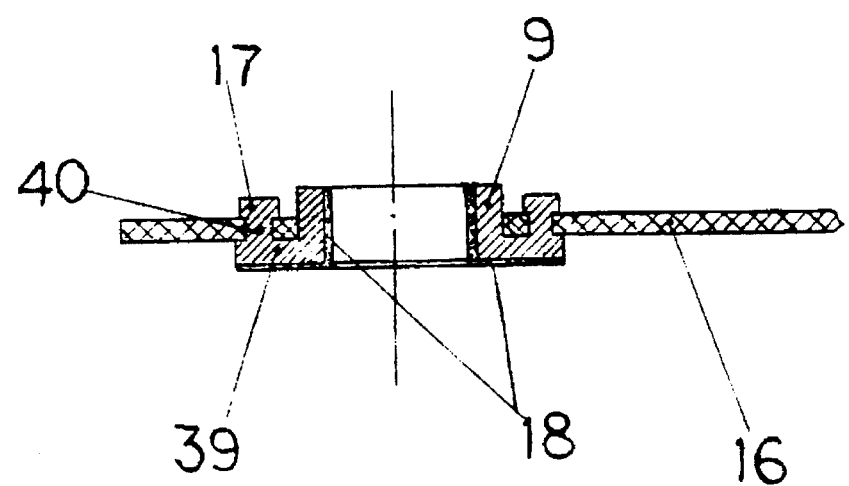
Figure 8:
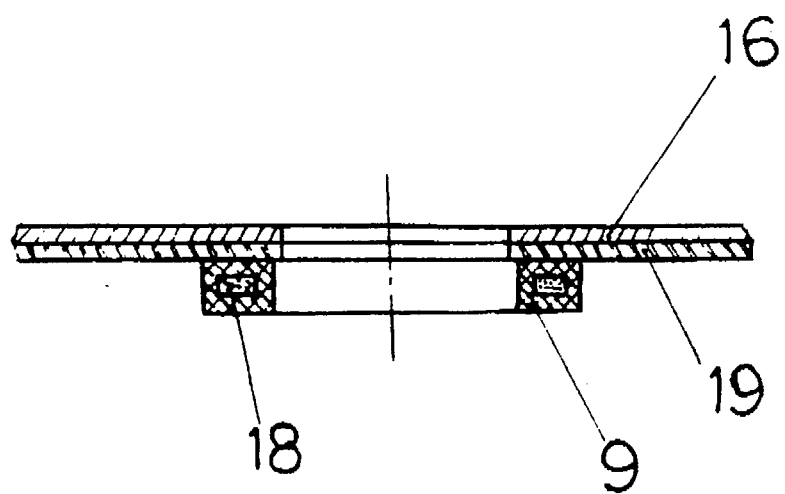
Figure 9:
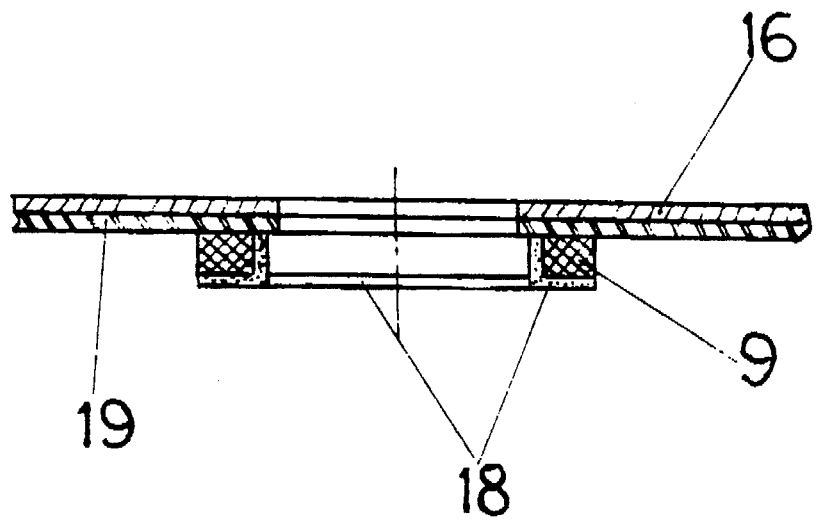

FIG. 5 is a perspective view of number 8 in FIG. 4, numerals:

| 9 | preformed solder ring |
| 16 | integrated retaining means |
| "D" | slots |

FIG. 6 to FIG. 9 are partial cross-sectional views taken along section line 6–9 in FIG. 5, which reveal the details of two different designs for flux arrangement and hollow shell solder preforms with radial arms having lugs with an enlarged end to serve as a lock for the retaining means, numerals:

| 17 | lock |
| 18 | flux inside or outside the deformed solder ring |
| 19 | chemical bonding material sticking layer |
| 39 | radial arms |
| 40 | lugs |

Figure 10:
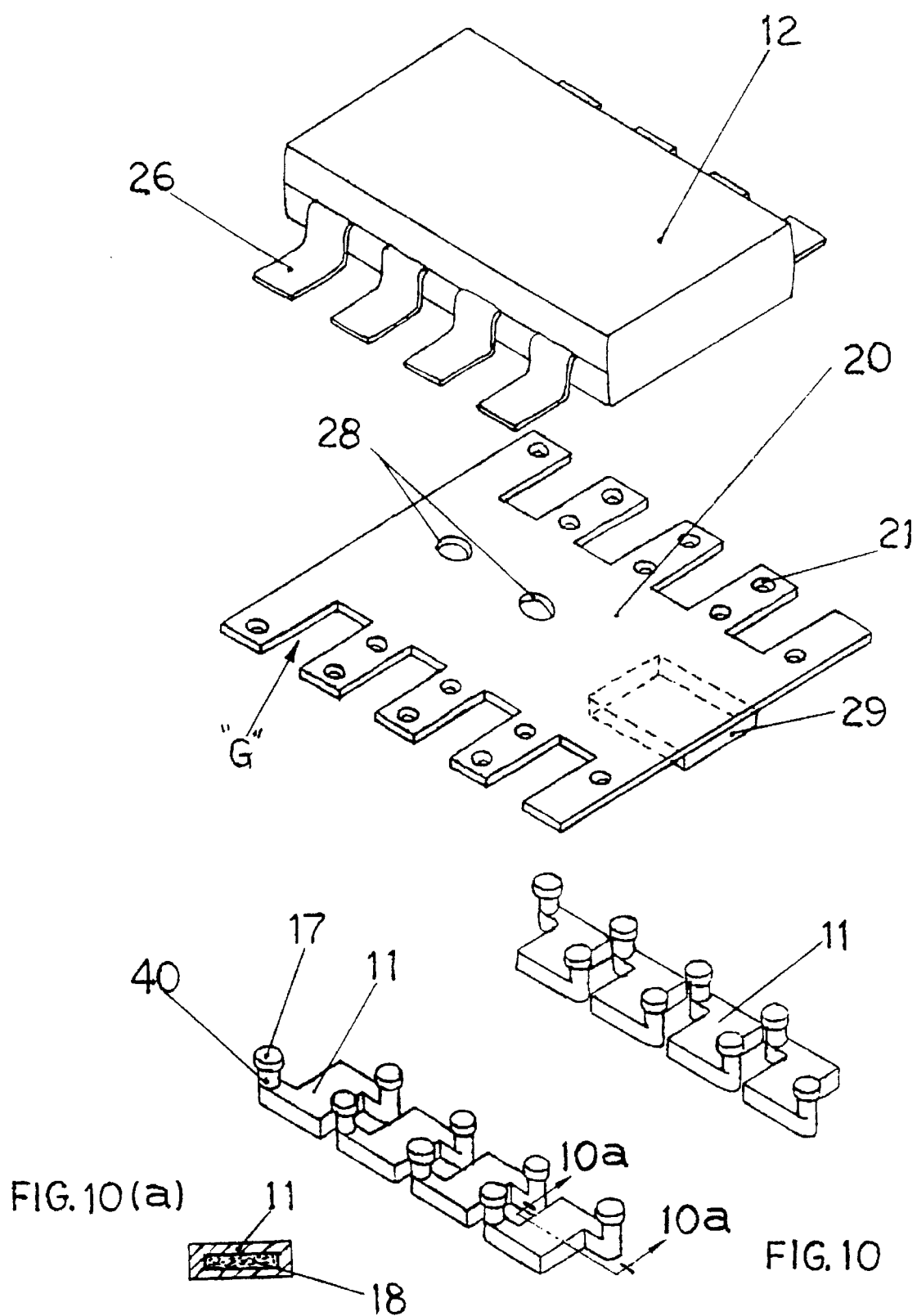

FIG. 10 is an exploded perspective view of a zig-zag preformed solder block delivery and array device of the invention for small out line integrated circuit package, numerals:

| 20 | a complete retaining means having a plurality of rectangular-shaped slots G which are according to the layout of the leads 26 of the component 12 |
| 21 | through hole for fitting lug 17 of preformed solder |
| 26 | lead of the component, number 12 |
| 28 | registration through holes in the retaining means number 20 for easy alignment on PCB |
| 29 | bonding sheet for fixing onto PCB |

Figure 11:
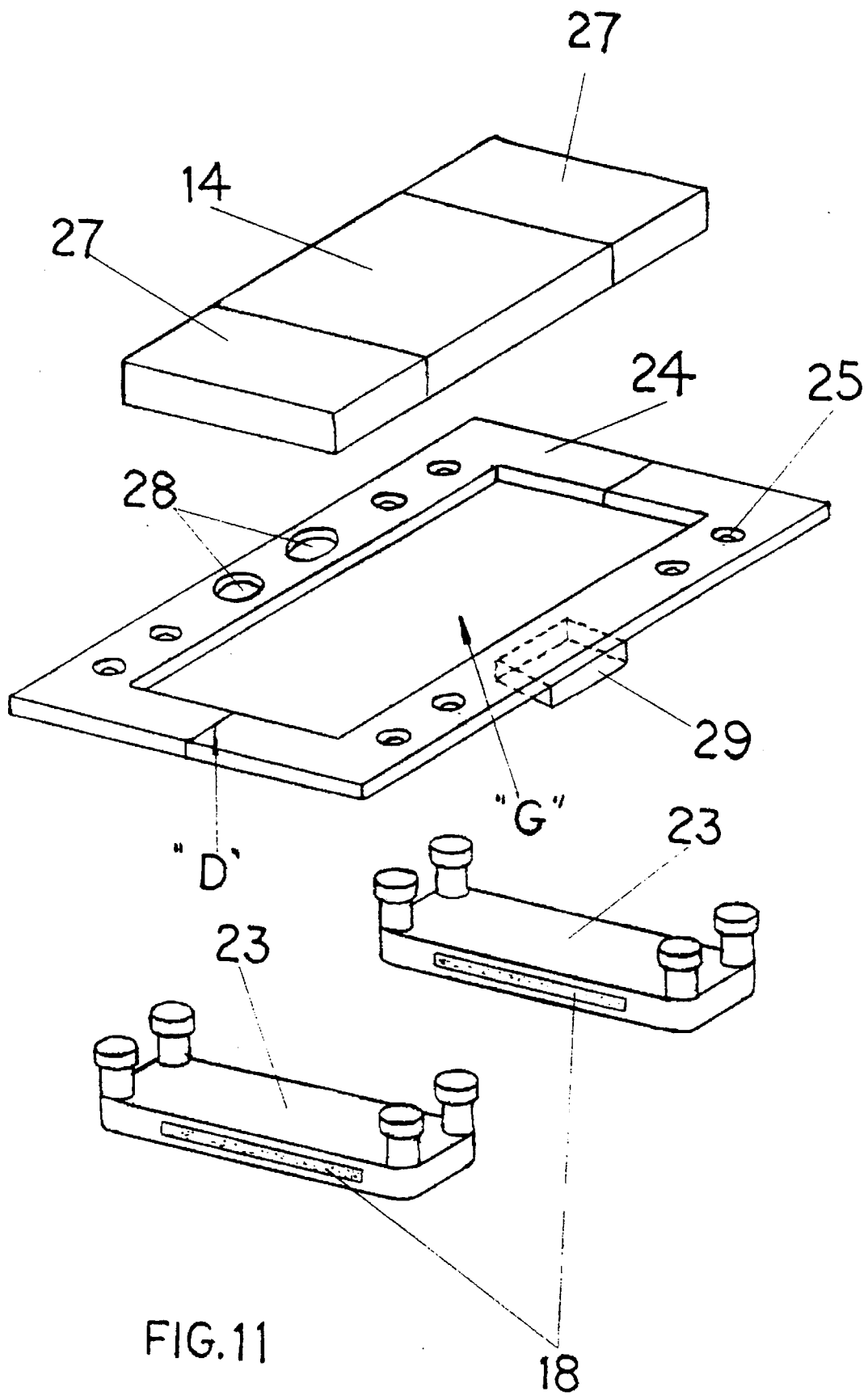

FIG. 10(a) is a cross-sectional view of section 10(a) in FIG. 10. FIG. 11 is an exploded perspective view of a preformed solder block delivery and array device of the invention for another surface mount type package, fixed by mechanical locking, numerals:

| 23 | preformed solder block |
| --- | --- |
| 24 | retaining means |
| 25 | through hole for fitting the lug of preformed solder |
| 27 | leads of component number 14 |
| "G" | spaced opening |
| "D" | slot |

Figure 12:
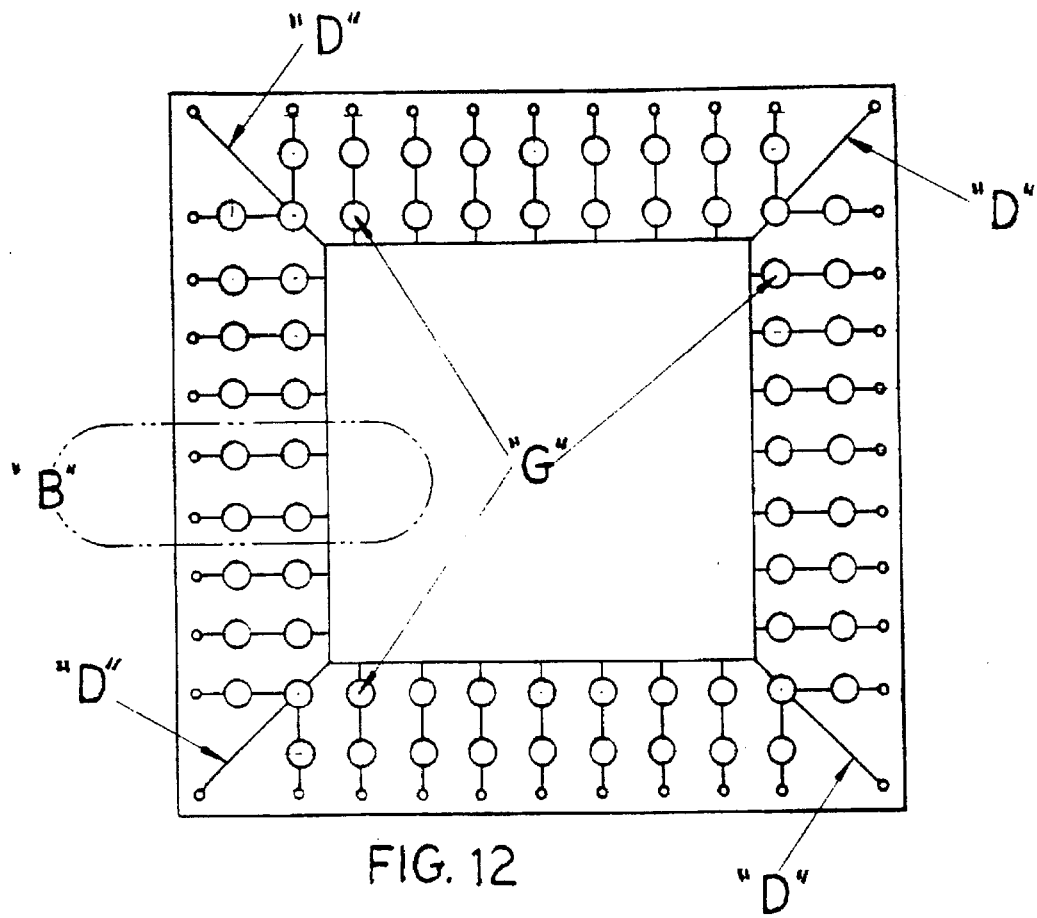

FIG. 12 is a top view of a preformed solder ring delivery and array device of the present invention for a Pin Grid Array package (PGA), fitting by chemical bonding, or mechanical locking, numerals;

| 41 | retaining means for PGA packag |
| --- | --- |

Figure 13:
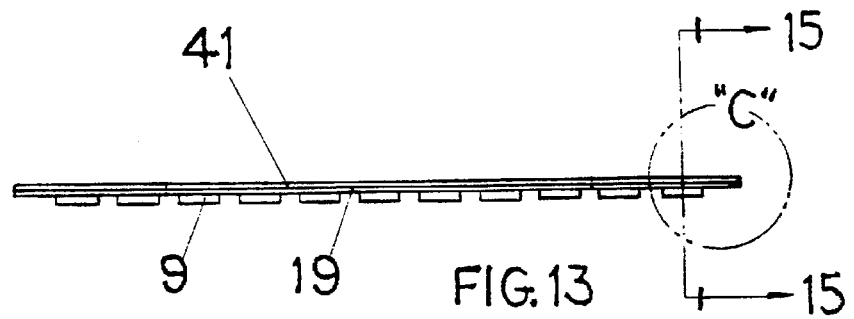

FIG. 13 is the side view of FIG. 12.

Figure 14:
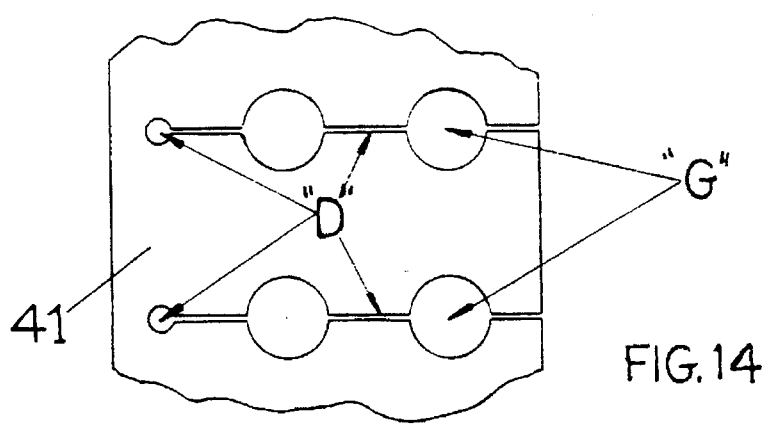

FIG. 14 is the enlarged partial view of the portion "B" in FIG. 12 (only retaining means).

Figure 15:
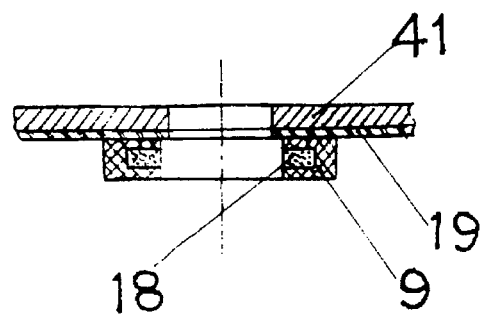

FIG. 15 is the enlarged cross-sectional view 15 of the part "C" in FIG. 13, wherein the solder preform is held by adhesive bonding.

Figure 16:
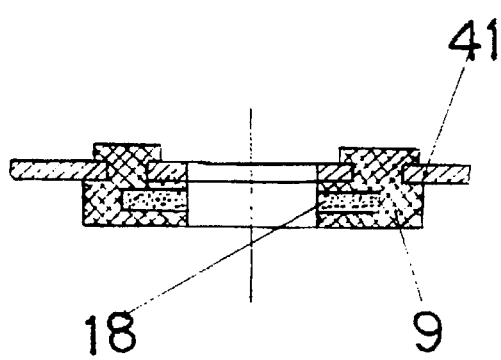

FIG. 16 is the enlarged cross-sectional view 16 of the portion "C" in FIG. 13 wherein the solder preform is fixed on the retaining means by mechanical locking with an enlarged end.

Figure 17:
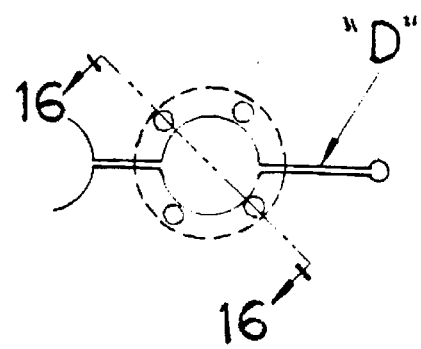

FIG. 17 is the top view of FIG. 16 with slot opening.

Figure 18:
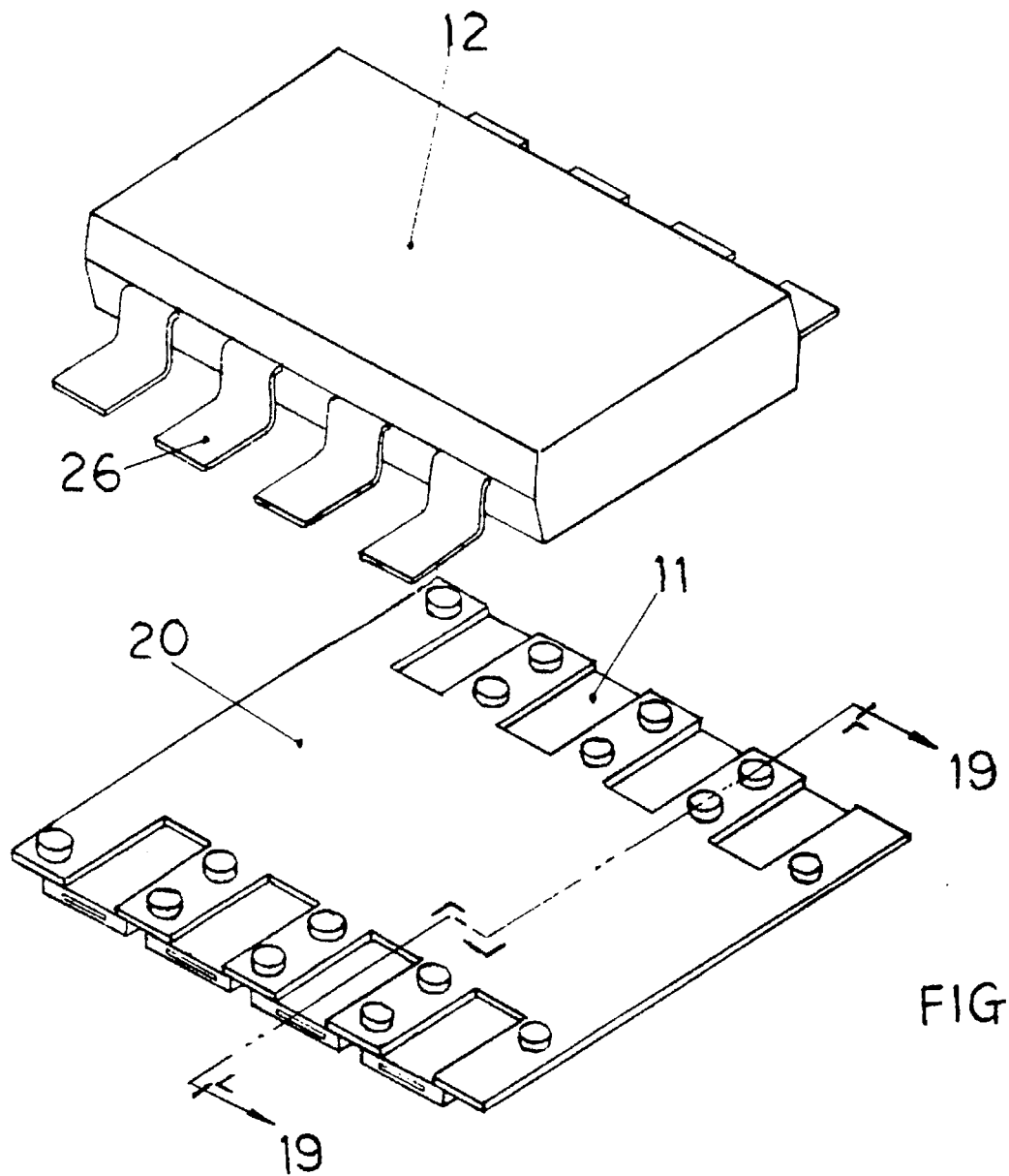

FIG. 18 is a perspective view of a preformed solder pad delivery and array device in FIG. 10, wherein the notches in the retaining means are designed for positioning the leads of surface mount type component by over lapping on the top side of the solder blocks.

Figure 19:
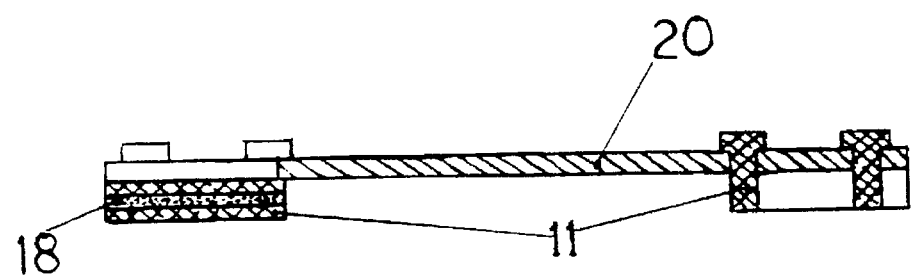

FIG. 19 is the partial cross-sectional enlarged view taken along section line 19 in FIG. 18.

FIG. 20 is an exploded perspective view of one of a preformed solder delivery and array device for a through hole type component of the present invention, wherein the solder is preformed in two or more than two arc pieces, or two bars with round, rectangular or any suitable shaped cross sections, and having lugs for fixed said solder preforms in the said retaining means, numerals;

| 30 | arc pieces of solder preforms |
| --- | --- |

FIG. 21 is an enlarged view of bar preforms

| 31 | bar pieces of solder preforms |
| --- | --- |
| 40 | lug |

FIG. 22 is an enlarged view of arc preforms

Figure 23:
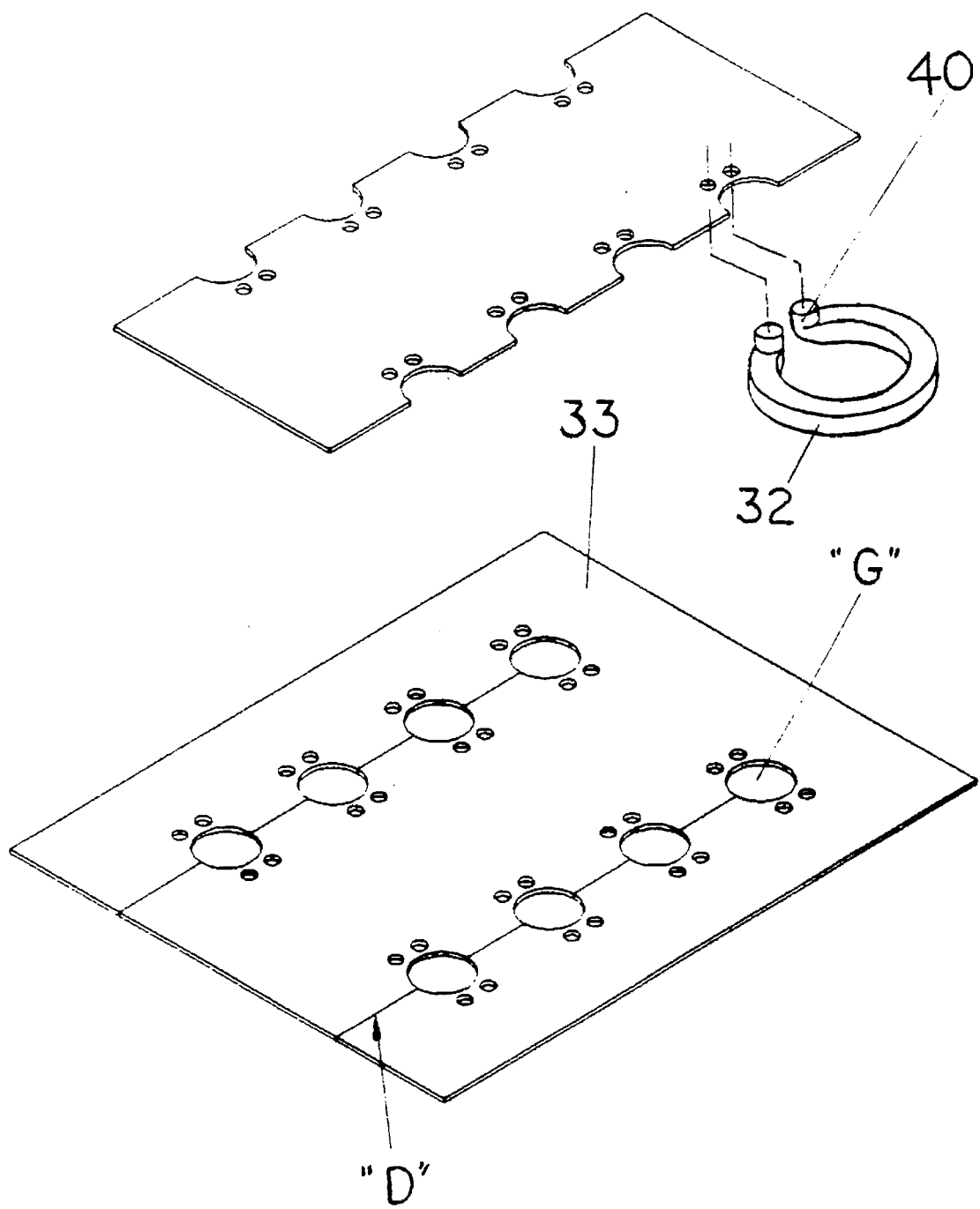

FIG. 23 is an exploded perspective view of one of the preformed solder delivery and array devices for through hole type components of the present invention, wherein the solder is preformed as a circular piece with an opening, having lugs for fixing said solder preforms in the said retaining means, numerals:

| 32 | circular piece with an opening of solder preforms |
| --- | --- |
| 33 | retaining means |
| 40 | lugs |

Figures 24, 25:
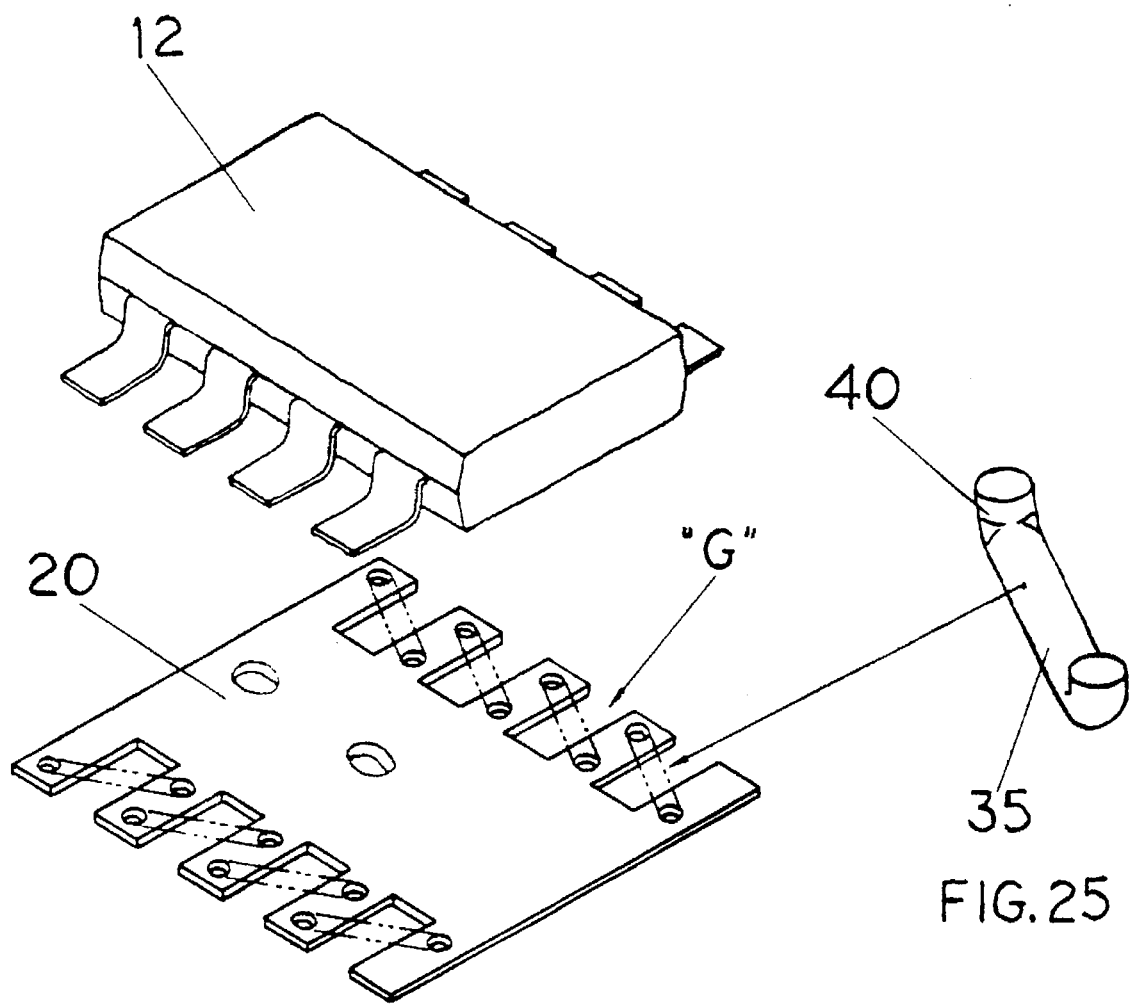

FIG. 24 is an exploded perspective view of one of the preformed solder delivery and array devices for surface mount type components of the invention, wherein the solder is preformed as a bar with round, rectangular or any suitable shaped cross sections, and having lugs for fixing the said solder preforms in the said retaining means, numerals:

| 35 | solder preformed bar |
| --- | --- |

FIG. 25 is an enlarged view of a bar solder preform.

FIGS. 26(a) and 26(b) are exploded perspective views of one of the solder delivery and array devices for"D-SUB Connector" and "Modular Connector" of the present invention, numerals:

| 36 | retaining means |
| --- | --- |
| 37 | D-SUB Connector |
| 38 | Modular connector |

Figure 27:
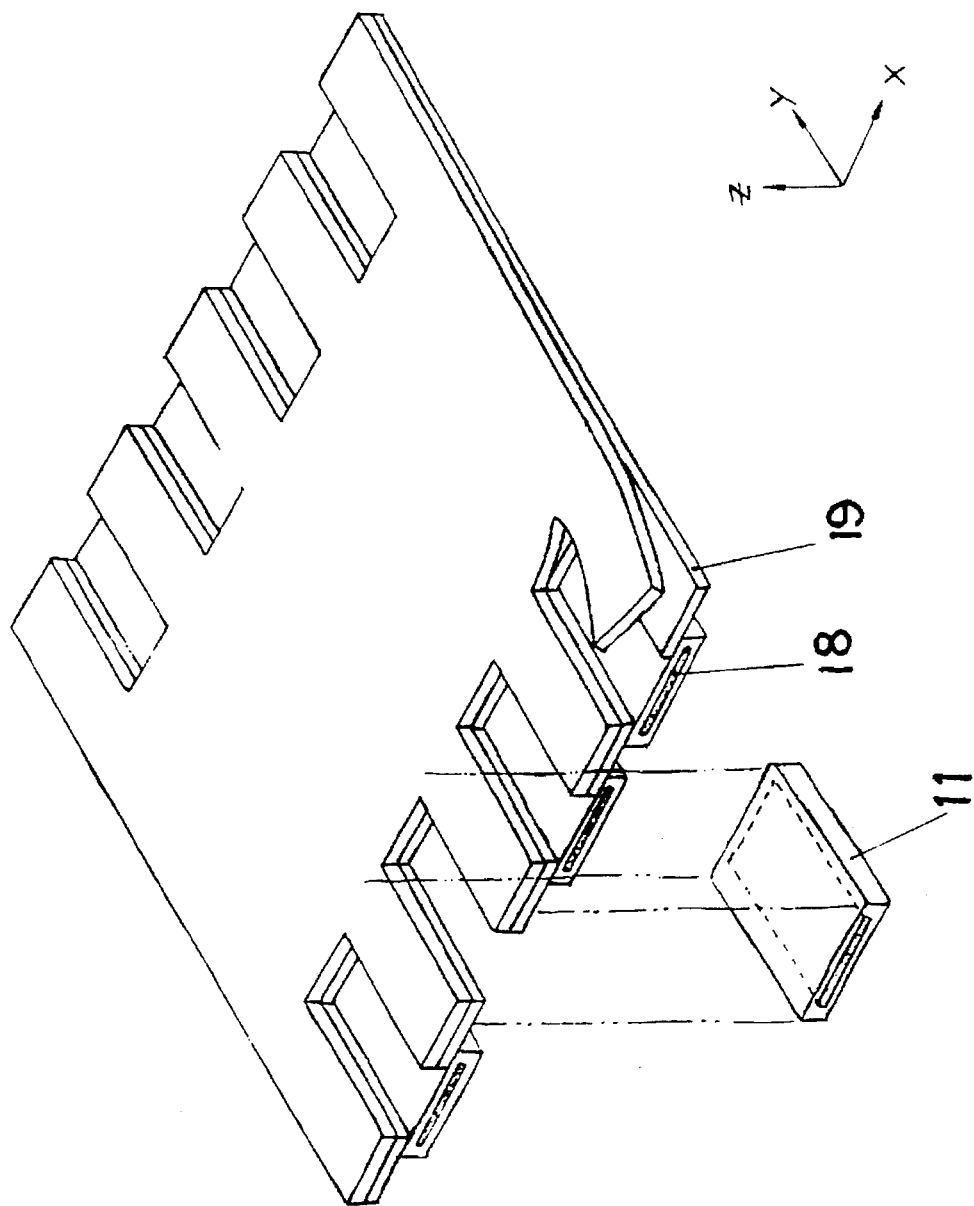

FIG. 27 shows the preformed solder block 11 positioned and fixed at said opening by chemical bonding with a sticking layer 19.

Figure 28:
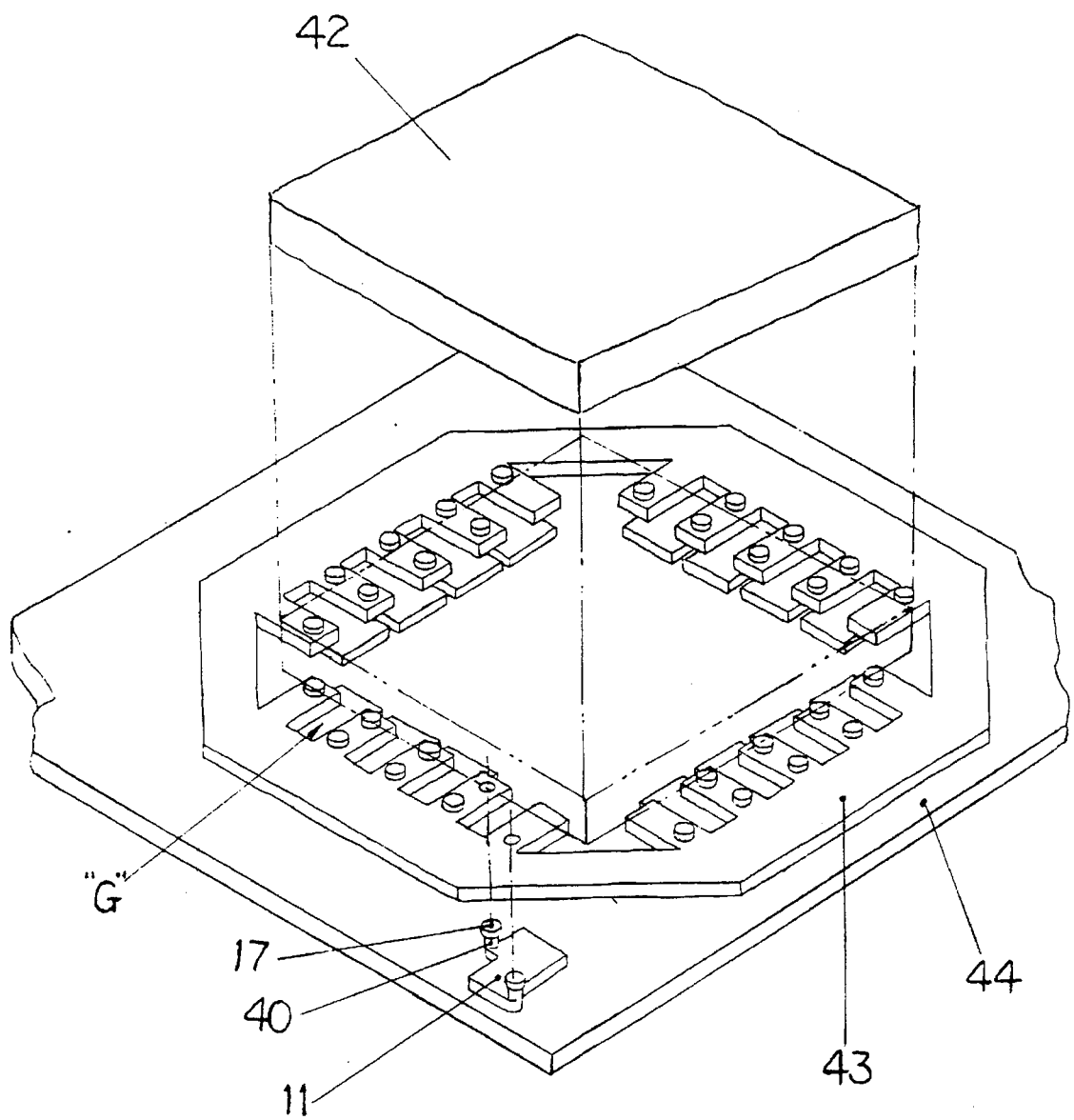

FIG. 28 shows a solder delivery and array device of the present invention used for IC chips, numerals:

| 42 | IC chip |
| --- | --- |
| 43 | retaining means |
| 44 | substrate |

In FIG. 5, 10, 11, 12, 14, 17, 20, 23, 24, 26, 28

| "D" | slots |
| --- | --- |
| "G" | spaced opening |

DESCRIPTION OF THE INVENTION
THROUGH PREFERRED EMBODIMENT

Referring to the drawings mentioned above, these are various solder delivery and array devices depicted in the embodiment of the present invention.

A solder delivery and array device labeled numeral 8 (FIG. 4) shows two of the solder delivery and array devices for soldering through hole type components 13, 15 including connector D-SUB Connector 37, Modular Connector 38 (FIG. 26), onto a PCB comprising of:

an eight-piece, a six-pieces, a three-pieces (FIG. 4, 5, 20), or one complete piece (FIG. 12, 21, 26) retaining means for positioning preformed solder with lugs 9 and with flux inside or outside on the surface (FIG. 4, 5, 6, 7, 8, 9), with predetermined weight, size, and shape, made of heat-resistant and flexible material sheet, having a plurality of spaced openings "G" (FIG. 12, 14, 20, 23, 26) which are, according to the layout of the pins or leads of said components (FIG. 5, 12, 20, 23, 26), and holes (FIG. 6, 7, also showing the holes holding the lugs) for housing and fixing solder preforms, and having slots "D" (FIG. 5, 11, 12, 14, 20, 23, 26) for the retaining means to be stripped off after heat reflow, being a complete piece or integrated by mechanical locking or chemical bonding with layer 19 (FIG. 8, 9, 15) applied through said solder preforms;

solder preformed rings 9 with flux 18 inside (FIG. 6, 8) or outside at the surface (FIG. 7, 9), and with predetermined weight, size and shape according to the size and shape of the pins or leads of said components, being a complete piece (FIG. 6, 7, 8, 9, 23) or integrated as one unit 30, 31 (FIG. 20) by a retaining means.

Said solder preforms 9 are positioned into or at said openings "G" and held there through mechanical locks (FIG. 6, 7), or chemical bonding (FIG. 8, 9) applied by the said retaining means.

The solder delivery and array devices 8, 10, 23 are located between electronic components 12, 13, 15, 14 and PCB 7 or substrate (FIG. 4) during the assembly process.

The solder preform with flux inside or outside on the surface can be formed as a hollow shell opened at the top and bottom 9 (FIG. 6, 7) for housing the pins or leads of said components 13, 15 (FIG. 4), having more than one radial arm 39 (FIG. 6, 7) with lugs 40 which are inserted into the holes of said retaining means and enlarged on the end by die press, or by laser heating, or by material deposition (plating or sputtering) to be formed as a mechanical lock 17 for fixing the integrated retaining means.

The solder preform with flux inside or on the outside of the surface can also be formed as two, or more than two, arched pieces 30 (FIG. 20) with lugs 40 which are inserted into the holes 21 of said retaining means 25, and enlarged on the end (as mentioned above) to be formed as a mechanical lock 17 (FIG. 22) for fixing the integrated retaining means.

The solder preform with flux inside or on the outside surface can also be formed as two, or more than two bars 31 (FIG. 20) with lugs 40 which are inserted into the holes 21 of said retaining means 20, and then enlarged on the end (as mentioned above) to be formed as a mechanical lock 17 (FIG. 21) for fixing the integrated retaining means.

The solder preform with flux inside or on the outside surface can also be formed as a ring 32 with openings (FIG. 23), having lugs 40 which are inserted into the holes 21 of said retaining means 33 and enlarged on the end (as mentioned above) to be formed as mechanical locks for fixing the integrated retaining means.

The present invention also provides two solder delivery and array devices 11, 23 (FIG. 4) for soldering surface mount type electronic components 12, 14 (FIG. 4) and 37, 38 (FIG. 26) to printed circuit boards, or substrates (FIG. 4), comprising:

a retaining means 20 (FIG. 10), 24 (FIG. 11), for positioning solder preforms with predetermined weight, sizes, and shapes, made of heat-resistant and flexible material sheet, having a plurality of spaced openings "G" and holes 21 (FIG. 10), or one opening "G" (FIG. 11) which are, according to the layout of the leads of said components for accommodating and/or fixing solder preforms, and having slots "D" (FIG. 11) for the retaining means to be stripped off after heat reflow, being a complete piece (FIG. 10) or integrated (FIG. 11) by mechanical locks or chemical bonding with a sticking layer 19 (FIG. 27) applied through solder preforms;

solder preformed block 23 (FIG. 11) with flux 18 inside (FIG. 19) or outside on the surface, and with predetermined weight, size and shape, according to the size and shape of the leads of said components.

Said solder preformed block 11 with lugs is positioned into or at said openings and held there by mechanical locks (FIG.19) and/or chemical bonding with sticking layer 19 (FIG. 27).

Said solder delivery and array device is located between electronic components and a PCB or substrate during the assembly process (FIG. 4, FIG. 28).

The solder preform with flux inside or on the outside surface can also be formed as a zig-fag 11 (FIG. 10) shaped block with lugs 40 which are inserted into the holes 21 of said retaining means, and enlarged at the end by die press, or laser heating, or material deposition (plating or sputtering) to be formed as mechanical locks 17 for fixing the integrated retaining means.

The solder preform with flux inside or on the outside surface can also be formed as bars 35 (FIG. 24) with lugs 40 which are inserted into the holes 21 of said retaining means, and enlarged on the end (as mentioned above) to be formed as a mechanical lock 17 for fixing the integrated retaining means.

The present invention also provides a solder delivery and array device for soldering IC chips 42 (FIG. 28) or PQFP device onto substrate 44 or PCB. It is comprised of:

a retaining means 43 for positioning solder preforms with lugs 40 of predetermined weight, size and shape, made of heat-resistant and flexible material sheet, having a plurality of spaced openings "G" which are, according to the layout of the IC chip, for accommodating and/or fixing solder preforms, being a complete piece or integrated by mechanical locks or chemical bonding with sticking layer (not illustrated) applied through solder preforms. The retaining means for the solder preforms mentioned above (FIG. 4, 5, 10, 11, 12, 18, 20, 23, 24, 26, 27, 28) are made of flexible and heat-resistant material, such as "Kapton" tape, and having a plurality of spaced openings and holes according to the layout of the pins and leads of the components mentioned above. The retaining means of the present invention is flexible and can be made as a complete piece or integrated into one. Its periphery can be made in the shape of rectangular-teeth. The thickness will be commonly from 76.210(E-6)m to 120.0 (E-6)m. For example, it can be made of polyamide film and other organic materials. There will be no problem to bend these retaining members into a 90° or larger angle. So it is easy to pull these retainers out from the space between components and a PCB or substrate after the soldering process. During the reflow operation, the solder preforms are melted to flow into spaces between pins and holes or leads and pads when they are heated, and the retainer originally locked by solder preforms will pull out freely, and can be used repeatedly. These solder delivery and array devices are suitable for attaching both through hole type and surface mount type parts on the printed circuit board at the same period in the heating reflow process. The solder preforms in the form of a ring/block are positioned as per the layout of the pins/leads of an electronic component package such as a through hole type for dual in line packages (DIP) as well as pin grid array devices (PGA) and surface mount types for small outline integrated circuit (SOIC) as well as plastic quad flat packages (PQFP). The components described above have four leads/pins or more. But some other have a fewer number of leads/pins for connections, for example it may have three leads/pins or less such as capacitors, resisters, transistors or test lugs.

The quantity of the solder preforms is determined by the final joint enclosure which includes both the filler portion and fillet. The position of the openings on the retaining means conforms to the component physical specifications of the Joint Electronic Device Engineering Council (JEDEC). The material for the retaining means is made by a piece of flexible ribbon such as KAPTON tape. So this means can be pulled out easily after the heat fellow process. Consequently the final product from this invention can be used by non-skilled persons to increase their productivity. In the heat reflow process, the solder preforms with a predetermined quantity will melt and fill the space around the exact interconnection area. The solder preforms will change their physical shape in the liquid phase. When the temperature drops, the solder residue will be extracted, through the proper designed locking hole on the retainer. This is accomplished by the effects of surface tension and the solidification process. No more locking mechanisms will exist along these segments on the retaining means. They will disengage and can be pulled out after the completion of the heat reflow operation. As to the solder delivery and array system joined by adhesive method, they also go through the same procedure described in the previous paragraph. The only discrepancy is the adhesive to be replaced by the locking mechanism.

Advantages of the invention

The present invention provides a solder ring delivery and array device which permits the flux deposition/cleaning to be more exactly controlled at the respective location than has been done by the well-known wave soldering system which uses flux in the pre-soldering stage and solvent to clean flux after soldering. Manpower is also saved due to the masking work done on unwanted-solder holes on the PC board. This is not required if the solder ring delivery and array device is used.

The present invention also provides a solder delivery and array device to be able to be used in the surface mount process. This will cut both the cost and the leadtime for a stencil mask and an emulsion screen. Since this tooling is not used, huge storage space and inventory work can be saved.

In addition, the present invention provides a solder delivery and array device which needs only one piece of equipment for both through hole type packages and surface mount type packages to do the solder reflow process in the same time after that all desired components are loaded on the printed circuit board. Only one stuffing and cleaning process is needed in the whole assembly operation which originally required two separate procedures, i.e. wave soldering for though hole type parts and reflow soldering for surface mount components.

Therefore the present invention eliminates both the required expensive equipment and setup time for stencil mask/emulsion screen alignment before the solder paste deposition operation. Consequently, all the concerns during solder cream printing, such as slump resistance, tack force and open time can be neglected. Other things like handling/storage for PC boards with solder paste and parts attached can not be done easily but this invention will in some degree lock the leads of the surface mount type components by the teeth shaped rectangular format of the retaining means which is held on the printed circuit board by a small piece of adhesive 29 (FIG. 10) or registration hole 28.

This invention provides a solder delivery and array device to assemble the pin grid array components to a PCB without overheating during the soldering process, because there is no more wave soldering in the process, and only the proper amount of solder is used at the interconnection area.

Therefore, the invention has notable advantages to available techniques.

Although the description above contains many specificities, these should not be construed as limiting the scope of the invention, but as merely providing illustrations of some of the presently embodiments of this invention.

I claim:

1. A solder delivery and array device for soldering electronic components having surface mounting leads or through hole pins to a printed circuit board, comprising:

a solder preform, said solder preform having a body portion, a plurality of lugs and corresponding lockers, a means for retaining said solder preform including a flexible sheet material having a plurality of openings therein for receiving said lugs, and wherein each of said lockers includes an enlarged portion for locking said plurality of lugs in said plurality of openings to prevent said body portion from disassociating from said retaining means.

2. A solder delivery and array device as in claim 1 wherein said flexible sheet material further including at least one slot for facilitating removal of said retaining means after soldering.

3. A solder delivery and array device as in claim 2 wherein said retaining means includes registration holes for aligning the solder delivery and array device with said components or said printed circuit board.

4. A solder delivery and array device as in claim 2 wherein said solder preform body portion is ring shaped for the receipt of a component through hole pin.

5. A solder delivery and array device as in claim 4 wherein said ring shaped body portion includes radial arms parallel to said retaining means, said lugs being integral with said radial arms.

6. A solder delivery and array device as in claim 2 wherein said solder preform body portion is rectangular block shaped.

7. A solder delivery and array device as in claim 2 wherein said solder preform body portion is zig-zag shaped.

8. A solder delivery and array device as in claim 2 wherein said solder preform body portion is bar shaped and said lugs are at distal ends thereof.

9. A solder delivery and array device as in claim 8 wherein said bar shaped portion is arcuate.

10. A solder delivery and array device as in claim 2 wherein said retaining means is a heat resistant, polyamide sheet divided by said at least one slot, and said solder preform straddles said at least one slot preventing said sheet from separating until soldering.

11. A solder delivery and array device as in claim 2 wherein said solder preform body portion includes a flux core.

12. A solder delivery and array device as in claim 2 wherein said solder preform body portion includes flux on the outer surface thereof.

13. A solder delivery and array device as in claim 2 wherein said solder preform comprises a plurality of solder preforms.

14. A solder delivery and array device as in claim 2 wherein said solder preform comprises a plurality of solder preforms having body portions of differing sizes or shapes.

15. A solder delivery and array device for soldering electronic components having surface mounting leads or through hole pins to a printed circuit board, comprising:

a solder preform, said solder preform having a body portion, a plurality of lugs and corresponding lockers, a means for retaining said solder preform including a flexible sheet material having a plurality of apertures for receiving said lugs, and an opening, wherein each of said lockers includes an enlarged portion for locking said plurality of lugs in said plurality of aperatures to prevent said body portion from withdrawing from said retaining means, and wherein said opening exposes said solder preform body portion to one side of the retaining means that is opposite to said solder preform body portion.

16. A solder delivery and array device as in claim 15 wherein at least a portion of said solder preform body portion is disposed inside said opening.

17. A solder delivery and array device as in claim 15 wherein said solder preform comprises a plurality of solder preforms, and said opening comprises a plurality of openings.

* * * * *